(12) United States Patent
Sax et al.

(10) Patent No.: US 12,040,288 B2
(45) Date of Patent: Jul. 16, 2024

(54) CHIP PACKAGE AND METHOD OF FORMING A CHIP PACKAGE

(71) Applicant: Infineon Technologies AG, Neubiberg (DE)

(72) Inventors: Harry Walter Sax, Straubing (DE); Johann Gatterbauer, Parsberg (DE); Wolfgang Lehnert, Lintach (DE); Evelyn Napetschnig, Diex (AT); Michael Rogalli, Rottenburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/236,858

(22) Filed: Aug. 22, 2023

(65) Prior Publication Data
US 2023/0395532 A1 Dec. 7, 2023

Related U.S. Application Data

(63) Continuation of application No. 17/333,186, filed on May 28, 2021, now Pat. No. 11,735,534.

(30) Foreign Application Priority Data

May 29, 2020 (DE) ...................... 10 2020 114 527.6

(51) Int. Cl.
*H01L 23/00* (2006.01)
*H01L 21/56* (2006.01)
*H01L 23/31* (2006.01)

(52) U.S. Cl.
CPC ............ *H01L 23/564* (2013.01); *H01L 21/56* (2013.01); *H01L 23/3142* (2013.01);
(Continued)

(58) Field of Classification Search
CPC ... H01L 23/564; H01L 21/56; H01L 23/3142; H01L 24/03; H01L 24/05; H01L 2924/365; H01L 23/4952; H01L 23/49582
See application file for complete search history.

(56) References Cited

U.S. PATENT DOCUMENTS

| | | | |
|---|---|---|---|
| 4,191,709 A * | 3/1980 | Parker | B01J 29/70 556/173 |
| 6,503,343 B1 * | 1/2003 | Tench | C23C 18/1651 148/272 |

(Continued)

FOREIGN PATENT DOCUMENTS

| | | |
|---|---|---|
| BR | 102013013758 | 9/2018 |
| BR | 102013013758 A2 * | 9/2018 |

(Continued)

OTHER PUBLICATIONS

A.N. Rider, et al., "Boiling Water and Silane Pre-Treatment of Aluminium Alloys for durable Adhesive Bonding", International Journal of Adhesion & Adhesives, Accepted Jun. 25, 1999.

(Continued)

*Primary Examiner* — Mamadou L Diallo
(74) *Attorney, Agent, or Firm* — Dicke, Billig & Czaja, PLLC

(57) ABSTRACT

A chip package is provided. The chip package may include at least one chip, an exposed metal region and a metal protection layer structure over the exposed metal region and configured to protect the metal region from oxidation. The protection layer structure includes a low-temperature deposited oxide, and a hydrothermally converted metal oxide layer over the protection layer structure.

20 Claims, 5 Drawing Sheets

(52) U.S. Cl.
CPC .............. *H01L 24/03* (2013.01); *H01L 24/05* (2013.01); *H01L 2224/0382* (2013.01); *H01L 2224/05687* (2013.01); *H01L 2924/365* (2013.01)

(56) References Cited

U.S. PATENT DOCUMENTS

| | | | |
|---|---|---|---|
| 8,410,586 B2 | 4/2013 | Riedl et al. | |
| 2003/0022454 A1* | 1/2003 | Wang | H01L 28/75 257/E27.088 |
| 2007/0020955 A1* | 1/2007 | Song | H01L 21/02282 438/778 |
| 2009/0325787 A1* | 12/2009 | Fu | C09C 1/0084 502/227 |
| 2010/0273095 A1* | 10/2010 | Li | H01M 8/0228 252/519.3 |
| 2012/0164434 A1 | 6/2012 | Ramadas et al. | |
| 2012/0168968 A1 | 7/2012 | Lee et al. | |
| 2014/0377545 A1* | 12/2014 | Karvitz | C08K 3/22 524/96 |
| 2015/0115414 A1* | 4/2015 | Umehara | H10N 30/00 438/669 |
| 2015/0221886 A1 | 8/2015 | Klun et al. | |
| 2017/0018590 A1* | 1/2017 | Yiu | H01L 24/19 |
| 2019/0123273 A1* | 4/2019 | Lee | H10N 70/883 |
| 2019/0214323 A1 | 7/2019 | Hsieh et al. | |
| 2020/0043876 A1* | 2/2020 | Napetschnig | H01L 23/49586 |
| 2020/0192120 A1* | 6/2020 | Suzuki | G02C 7/021 |
| 2021/0020835 A1* | 1/2021 | Lee | H10N 70/023 |
| 2021/0255381 A1* | 8/2021 | Dong | C23F 1/16 |
| 2021/0337696 A1* | 10/2021 | Lin | H05K 7/205 |
| 2021/0375792 A1 | 12/2021 | Sax et al. | |

FOREIGN PATENT DOCUMENTS

| | | | | |
|---|---|---|---|---|
| CN | 102382422 | | 3/2012 | |
| CN | 110217835 | | 9/2019 | |
| CN | 110217835 A | * | 9/2019 | ............ B82Y 40/00 |
| CN | 111081641 | | 4/2020 | |
| CN | 111081641 A | * | 4/2020 | ............ H01L 23/29 |
| DE | 10 2018 210 658 | | 1/2020 | |
| DE | 10 2018 118 544 | | 2/2020 | |
| JP | S5815239 | | 1/1983 | |
| JP | 2014034495 | | 2/2014 | |
| JP | 2014034495 A | * | 2/2014 | |

OTHER PUBLICATIONS

D. A. Vermilyea, et al. "Inhibition of Aluminum and Water Reaction", Physical Chemistry Laboratory.

Non-Final Office Action dated Nov. 9, 2022 in U.S. Appl. No. 17/333,186.

* cited by examiner

.US 12,040,288 B2

CHIP PACKAGE AND METHOD OF FORMING A CHIP PACKAGE

CROSS-REFERENCE TO RELATED APPLICATION

The present application is a continuation application of U.S. patent application Ser. No. 17/333,186, filed May 28, 2021, and claims priority to German Patent Application No. 10 2020 114 527.6, filed May 29, 2020, which are both incorporated herein by reference.

TECHNICAL FIELD

Various embodiments relate generally to a chip package and to a method of forming a chip package.

BACKGROUND

A chip package may include various materials that form interfaces with an encapsulation material, e.g. a mold compound. A strong and long-term reliable adhesion between the various materials, in particular metal surfaces, and the molding compound may be required to ensure a high reliability of the chip package. Furthermore, the chip package may require protection from moisture and from oxidation of the metal surfaces.

SUMMARY

A chip package is provided. The chip package may include at least one chip, an exposed metal region, a metal protection layer structure over the exposed metal region and configured to protect the metal region from oxidation, the protection layer structure including a low-temperature deposited oxide, and a hydrothermally converted metal oxide layer over the protection layer structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
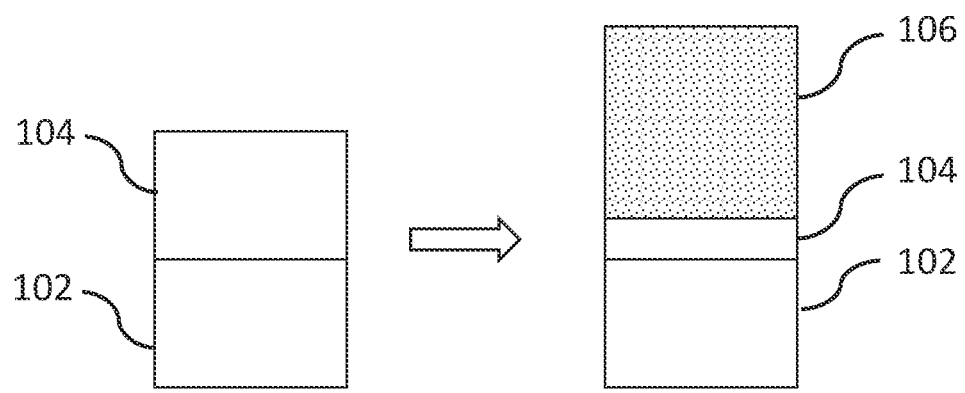
FIG. 1 visualizes a method of forming a chip package according to prior art.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Future requirements regarding chip packages are asking for resistance to temperatures of up 200° C. in testing and service while providing the same or better reliability. In order to achieve this, new solutions have to be found for preventing a substrate from oxidation while being compatible with current and future material sets.

Various processes have been proposed or used in the past to enhance an adhesion of an encapsulation material to encapsulated structures, e.g. metal surfaces, in a chip package, all of which having one or more disadvantages.

In a known process for forming an inorganic adhesive, Zn/Cr dendrites are grown electrochemically on (e.g. metal) surfaces. This may be a relatively cheap process that may allow to provide reliable adhesion between the surfaces and an encapsulation material, and may even provide a moisture and oxidation prevention. However, the electrochemical process that is used for forming the dendrites requires Cr-6, which is carzinogenic.

In a so-called primer treatment, bi-functional silanes (e.g. aminopropyltriethoxysilane) may be dispensed on the (e.g. metal) surface to provide adhesion between metals and the encapsulation material, e.g. epoxy molding compounds. This may be easy to implement, and the silanes are not carcinogenic. However, the adhesion is less reliable than the adhesion provided by the A2 process, and no protection from oxidation is provided.

A (metal) surface roughening may be performed on a leadframe surface, which may be easy to implement and provide a cheap, strong adhesion promotion. However, no oxidation protection is provided, and the adhesion promotion is limited to the leadframe even though the chip top is always a critical area.

An aluminum oxide ($Al_2O_3$) layer (with a silicon doping or a silicon oxide ($SiO_2$) capping to prevent a degradation of the $Al_2O_3$) may act as a reaction inhibitor and as a moisture barrier. However, the doped aluminum oxide or the silicon oxide may not allow for a strong adhesion to the encapsulation material.

By converting the aluminum oxide ($Al_2O_3$) into "coral" like pseudo-bohemite structures by a hydrothermal process, a very strong adhesion promotion may be achieved, and the material is not carzinogenic and can be grown on every surface even without electrical connection to a frame. However, an oxidation protection is not guaranteed, and no moisture barrier is provided.

A metal structure 102 that may be part of a prior art chip package is shown in FIG. 1. On the metal structure 102, the converted aluminum oxide 106 may be arranged by forming an aluminum oxide layer 104 (shown on the left side) and by hydrothermally converting the aluminum oxide layer 104 to form the hydrothermally converted metal oxide layer 106 (shown on the right side).

The AlOOH dendrites have an open porous structure that has shown very good potential to be a suitable adhesion promoter for current and future mold materials, which have a wide range in terms of filler size and viscosity.

However, the hydrothermally converted metal oxide layer 106 has a weak point in terms of corrosion protection in moist conditions.

Typically, the hydrothermal conversion may convert the full aluminum oxide layer 104 to the hydrothermally converted metal oxide layer 106, or may leave only a very thin residual non-converted aluminum oxide layer (not shown).

A reason for this is that, for economic reasons, the aluminum oxide layer 104 must be as thin as possible and needs to be as thick as necessary to give enough roughness to provide strong adhesion. In this thickness range (approximately between 1 and 30 nm) it may be difficult to control that the remaining thickness of the dense (i.e., not hydrothermally converted) aluminum oxide layer 104 is sufficient to prevent a future oxidation of the metal structure 102. This may, however, be necessary to assure a good adhesion, especially if the metal structure 102 is a copper leadframe. Thus, if only temperature and time are controlled during the hydrothermal conversion process, there is a high risk that the remaining aluminum oxide layer 104 is too thin to protect the metal structure 104 from moisture and oxidation.

But even if it was possible to control the desired remaining thickness of the dense layer of aluminum oxide 104 that may remain after the (in that case, partial) hydrothermal conversion, no guaranteed long-term protection would be achieved: Tests have shown that the conversion process will continue in hot moist environment, and further adhesion degradation and moisture penetration cannot be prevented.

In various embodiments, chip package with a layer stack is provided that includes, on an exposed metal region of the chip package, a metal protection layer structure and a hydrothermally converted metal oxide layer over the protection layer structure. The protection layer structure may be configured to protect the metal region from oxidation (in other words, "metal protection layer structure" is to be understood as "protection layer structure for protecting metal", rather than "protection layer structure made from metal").

In various embodiments, the protection layer structure may have an oxidation protection layer and a degradation protection layer protecting the oxidation protection layer from degradation, for example by acting as a moisture barrier. The oxidation protection layer may for example include or consist of a metal oxide, e.g. aluminum oxide. The degradation protection layer may for example include or consist of an oxide, for example silicon dioxide.

The hydrothermally converted metal oxide layer, e.g. a hydrothermally converted aluminum oxide layer (also referred to as "bohemite aluminum hydroxide"), may act as an adhesion promoter for increasing an adhesion between the exposed metal region (optionally, additionally between other exposed surfaces) and an encapsulation material.

In various embodiments, a method of forming a chip package with an increased process control of a process of forming an adhesion promoter via hydrothermal conversion of aluminum oxide and, as a result, an improved reliability of the formed chip package, is provided.

Figure 2A:
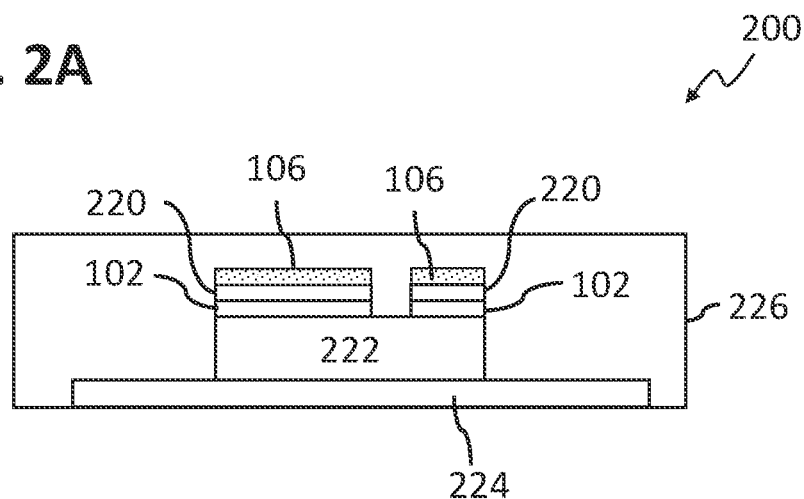
FIGS. 2A to 2C show a schematic cross-sectional view of a chip package in accordance with various embodiments.
Figure 2B:
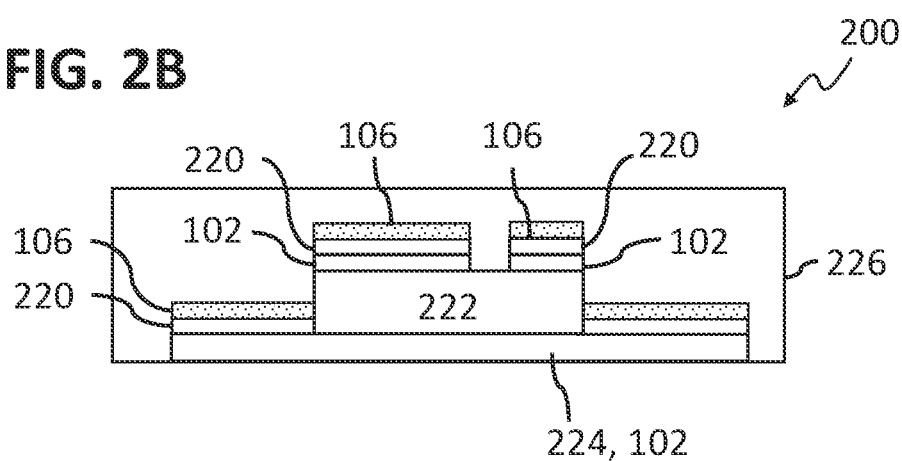
Figure 2C:
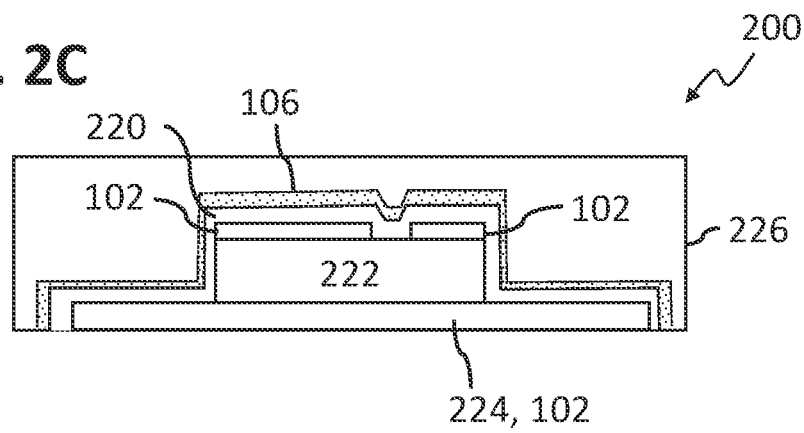

Each of FIG. 2A to 2C shows a schematic cross-sectional view of a chip package 200 in accordance with various embodiments, and each of FIG. 3A to FIG. 3D visualizes a method of forming a chip package 200 according various embodiments.

The chip package 200 may include at least one chip 222, for example a semiconductor chip.

The chip package 200 may include an exposed metal region 102. FIG. 2A shows an embodiment in which the exposed metal region 102 is a chip pad, for example a source pad and/or a gate pad. In various embodiments, the exposed metal region may alternatively or additionally include a different or further chip pad (for example a drain pad), a leadframe (as shown in FIGS. 2B and 2C), a wire bond, a clip, and a stripe bond, etc.

The exposed metal region 102 may in various embodiments include at least one of a group of materials, the group consisting of copper (Cu), nickel (Ni), aluminum (Al), gold (Au), silver (Ag), palladium (Pd), and alloys thereof, for example NiP and/or PdAuAg.

The chip package 200 may further include a metal protection layer structure 220 over the exposed metal region 102.

The chip package 200 may further include a hydrothermally converted metal oxide layer 106 over the protection layer structure 220.

The metal protection layer structure 220 may be configured to protect the exposed metal region 102 from oxidation. The protection layer structure 220 may include or consist of a low-temperature deposited oxide. The low-temperature deposited oxide may include or consists of an amorphous oxide or a microcrystalline oxide.

The protection layer structure 220 may have a thickness in a range from about 0.1 nm to about 20 nm, for example in a range from about 0.1 nm to about 10 nm, for example from about 0.5 nm to about 10 nm.

The low-temperature deposited oxide may include or consists of a metal oxide, for example titanium dioxide, zinc oxide, hafnium dioxide, tantalum pentoxide ($Ta_2O_5$), and zirconium dioxide. Alternatively or additionally, silicon dioxide may be used. The low-temperature deposited oxide may in various embodiments be arranged as a top layer of the metal protection layer structure 220. In other words, a topmost layer of the metal protection layer structure 220, which may be in direct contact with the hydrothermally converted metal oxide layer 106, may include or consist of titanium dioxide, zinc oxide, hafnium dioxide, zirconium dioxide, tantalum pentoxide ($Ta_2O_5$), and/or silicon dioxide.

Figure 3A:
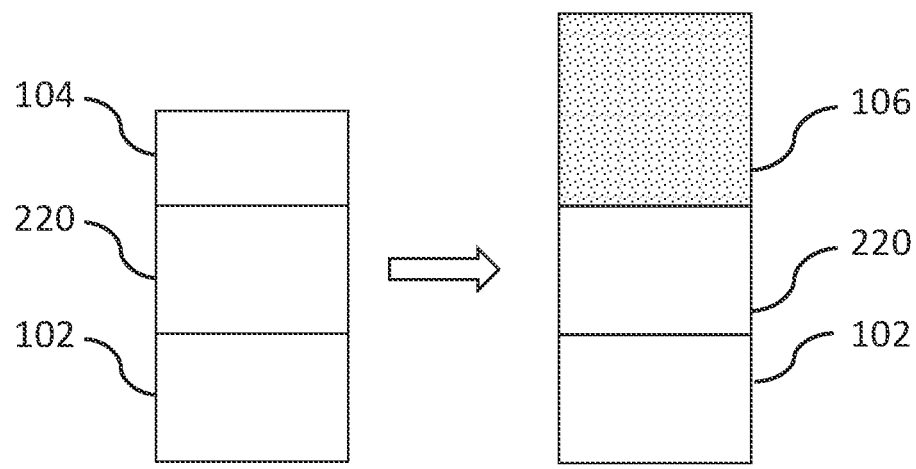
FIG. 3A to FIG. 3D visualizes a method of forming a chip package according various embodiments.
Figure 3B:
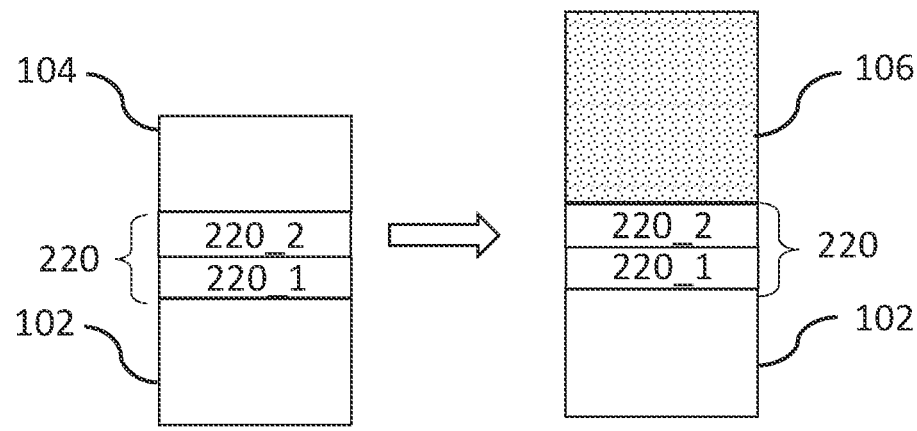
Figure 3C:
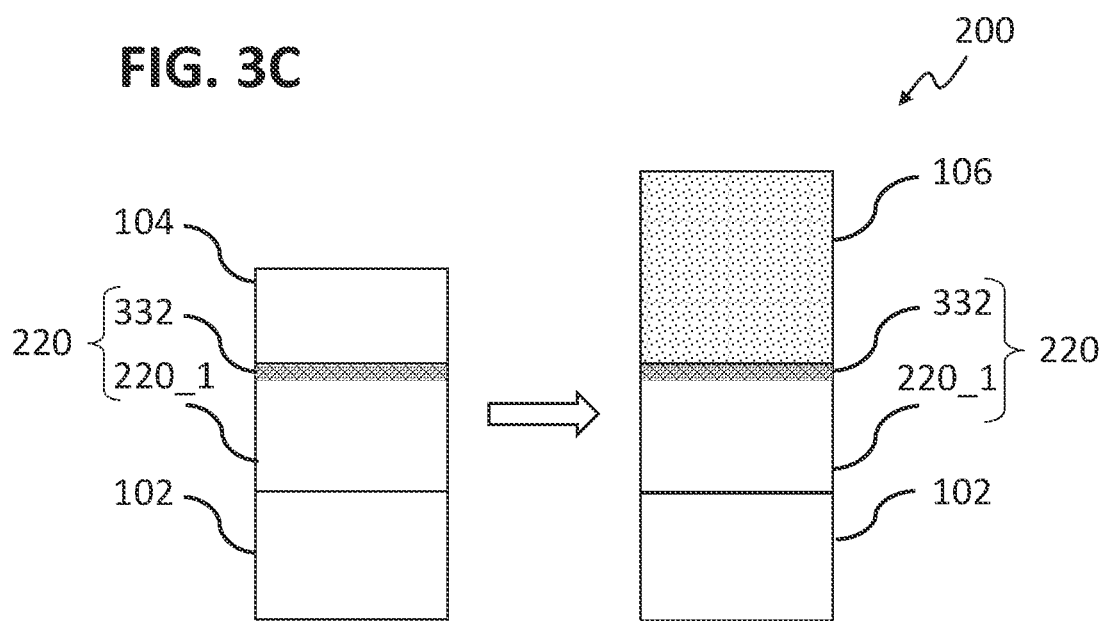
Figure 3D:
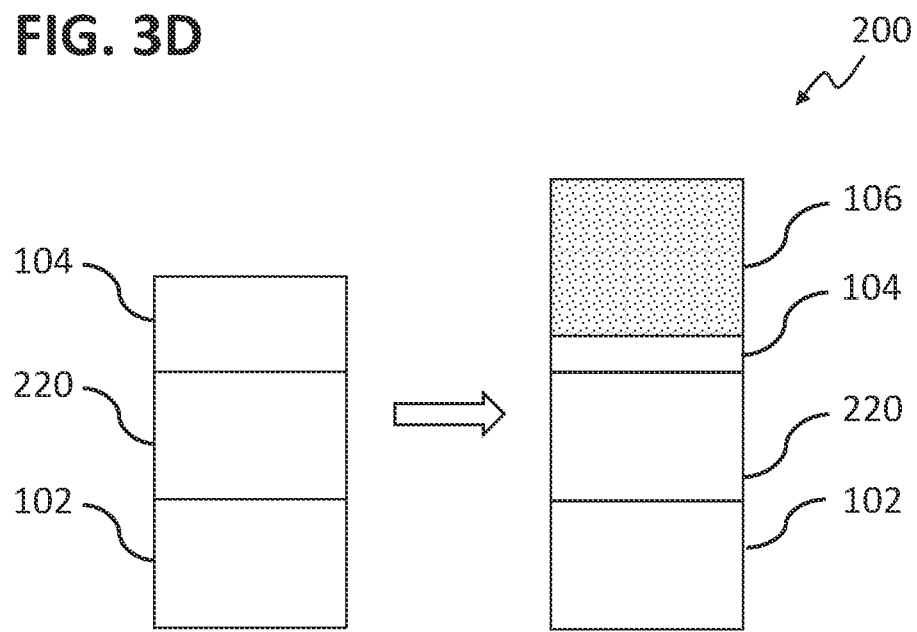

A case where the whole metal protection layer structure 220 is formed by the metal oxide is shown in FIG. 3A and FIG. 3D.

In various embodiments, the protection layer structure 220 may include aluminum oxide, for example as an oxidation protection layer 220_1. In that case, the aluminum oxide may be vulnerable to moisture.

As described in literature, a degradation of $Al_2O_3$ in hot moist environments may be prevented if a capping layer is added. Therefore, the oxidation protection layer 220_1 may in various embodiments be protected by a capping layer 220_2, e.g. including or consisting of titanium dioxide, zinc oxide, hafnium dioxide, tantalum pentoxide ($Ta_2O_5$), and zirconium dioxide, and/or silicon dioxide. This is shown in an exemplary fashion in FIG. 3B.

Alternatively or additionally, the aluminum oxide layer 220_1 may for example be doped, for example with silicon, in order to make the aluminum oxide layer 220_1 moisture resistant by forming a moisture resistant doped region 332 in the aluminum oxide layer 220_1. This is shown in an exemplary fashion in FIG. 3C.

In various embodiments, the hydrothermally converted metal oxide layer 106 may include or consists of an aluminum hydroxide layer. The hydrothermally converted metal oxide layer 106 may be formed over the protection layer structure 220 by forming a metal oxide layer 104, for example an aluminum oxide layer, over the protection layer structure 220, and by initiating a hydrolysis in the aluminum oxide layer 104, for example by applying heat and moisture simultaneously.

The hydrothermally converted metal oxide layer 106 may have a thickness in a range from about 1 nm to about 50 nm, for example in a range from about 3 nm to about 30 nm.

The hydrothermal conversion process may for example include placing the metal oxide layer 104 (e.g., a portion of the not-yet-encapsulated chip package 200, for example the complete not-yet-encapsulated chip package 200, with the metal oxide layer 104 forming the top surface) in a heated aqueous solution. Depending on a temperature and a duration of the hydrothermal conversion process, the metal oxide layer 104 may be completely converted to the hydrothermally converted metal oxide layer 106, or a layer 104 (which may be a partial layer) may remain between the metal protection layer structure 220 and the hydrothermally converted metal oxide layer 106.

In various embodiments, the chip package 200 may further include an encapsulation material 226, for example a mold compound, for example a mold compound as known in the art. The encapsulation material 226 may be attached to at least a portion of the exposed metal region 102 by the metal protection layer structure 220 and the hydrothermally converted metal oxide layer 106.

In various embodiments, the protection layer structure 220 and the hydrothermally converted metal oxide layer 106 may not only be formed over one or more exposed metal regions 102, but additionally over further regions.

The protection layer structure 220 and the hydrothermally converted metal oxide layer 106 may in various embodiments be formed over a non-metal region, for example over a semiconductor material. This is shown in an exemplary fashion in FIG. 2C, where the protection layer structure 220 and the hydrothermally converted metal oxide layer 106 cover portions of the chip 222 that are not covered by the metal pads 102.

In various embodiments, the chip package 200 may include a further non-metal region, for example a not-metal layer (not shown), wherein the encapsulation material is further attached to at least a portion of the non-metal region, e.g. the non-metal layer. The non-metal layer may for example include or consist of an organic material, for example an imide.

The metal protection layer structure 220 may be an adhesion layer structure 220. In various embodiments in which the metal protection layer structure 220 is a single layer, e.g. formed by a single material, the material may be selected to adhere to the exposed metal region 102 and to the hydrothermally converted metal oxide layer 106. This may be the case for each of the materials listed above for the metal protection layer structure 220.

In various embodiments in which the metal protection layer structure 220 is a multilayer formed by a plurality of single layers, it may be sufficient to select the materials of each of the layers to adhere to the respective layers with which it forms an interface.

The process shown in FIG. 3B will be described in more detail below for an exemplary embodiment.

A first layer, e.g. an oxidation protection layer 220_1, 104, which may consist of $Al_2O_3$, may be arranged on a substrate, for example at least on an exposed metal region 102 (for example an assembled device after wire bonding), for example using atomic layer deposition (ALD). A thickness of the aluminum oxide layer 220_1 may for example be in a range from about 1 nm to about 20 nm preferred, for example from about 3 nm to about 8 nm, e.g. about 5 nm.

Subsequently, a second layer, e.g. a capping layer 220_2, which may for example include or consist of silicon dioxide, titanium dioxide, zinc oxide, hafnium dioxide, tantalum pentoxide ($Ta_2O_5$), and/or zirconium dioxide, may be deposited onto the first ($Al_2O_3$) layer 220_1, 104 to prevent a future degradation of the first ($Al_2O_3$) layer 220_1 under hot moist conditions, and to act as a reaction stop for the later following hydrothermal conversion.

Subsequently, as a third layer, aluminum oxide 104 may be deposited onto the second layer 220_2. The aluminum oxide 104 may be hydrothermally converted into a porous bohemite like AlOOH structure that may provide excellent adhesion promotion.

By the above described process, the metal protection layer structure 220 may be formed as a stack of $Al_2O_3/SiO_2/Al_2O_3$.

The bottom layer 220_1 of $Al_2O_3$ may be deposited at a temperature and thickness that is sufficient to prevent the future oxidation of the beneath substrate (e.g. a Cu leadframe).

The top $Al_2O_3$ layer 104 may be deposited at a thickness that can later be transformed into the adhesion promoting structure (the hydrothermally converted metal oxide layer 106) by the hydrothermal process (e.g. the hot water dipping).

As another way to phrase it: Since the hydrothermal conversion is difficult to control in terms of not completely transforming the entire aluminum oxide 104 that is present into a adhesion promoting structure 106 (whereby the oxidation protection provided by the aluminum oxide would be lost), a center layer 220 is provided in order to make the process controllable.

The center layer 220, which may for example include or consist of silicon dioxide, titanium dioxide, zinc oxide, hafnium dioxide, tantalum pentoxide ($Ta_2O_5$), and/or zirconium dioxide, may be able to actively prevent that the entire aluminum oxide layer 104 is transformed into the adhesion promoting structure 106, and may therefore ensure that, after the hydrothermal process, there is still enough aluminum oxide 220_1 on the below substrate 102 to prevent future oxidation. Apart from a viable process control (self-limiting process), the center layer 220 of silicon dioxide, titanium dioxide, zinc oxide, hafnium dioxide, tantalum pentoxide ($Ta_2O_5$), and/or zirconium dioxide may be an effective moisture barrier to prevent moisture to migrate to the chip surface, e.g. into and/or along the exposed metal region 102.

The chip package 200 may provide excellent adhesion promotion between the exposed metal region 102 (and, optionally, further regions of the chip package 200 that form an interface with an encapsulation material) and the encapsulation material 226, e.g. a molding compound.

The chip package 200 may further assure that there is no further degradation of a dense aluminum oxide layer 104 that may act as an oxidation protection for the exposed metal region 102. Furthermore, the intermediate layer 220 may provide a self limiting process stop for the hydrothermal conversion step, which may lead to a significant reduction of the machine cost for this process.

Combinations of the embodiments of FIG. 2A to 2C with each other and/or combinations of the embodiments of FIG. 3A to 3D with each other may be used, like for example having the $Al_2O_3$ layer 222 below (as in FIG. 3B) and the $Al_2O_3$ layer 104 above (as in FIG. 3D) the metal protection layer structure 220, or for example having the doped $Al_2O_3$ layer as the metal protection layer structure 220 (as in FIG. 3C) and combining it with the $Al_2O_3$ layer above the metal protection layer structure 220 (as in FIG. 2D). The chip pads 102 of FIG. 2A, the chip pads 102 and the leadframe surfaces 224, 102 of FIG. 2B, and/or the complete surface that interfaces with the encapsulation material 226 as shown in FIG. 2C may use, for their respective metal protection layer structure 220, any of the layer structures shown in FIG. 3A to 3D, etc.

Figure 4:
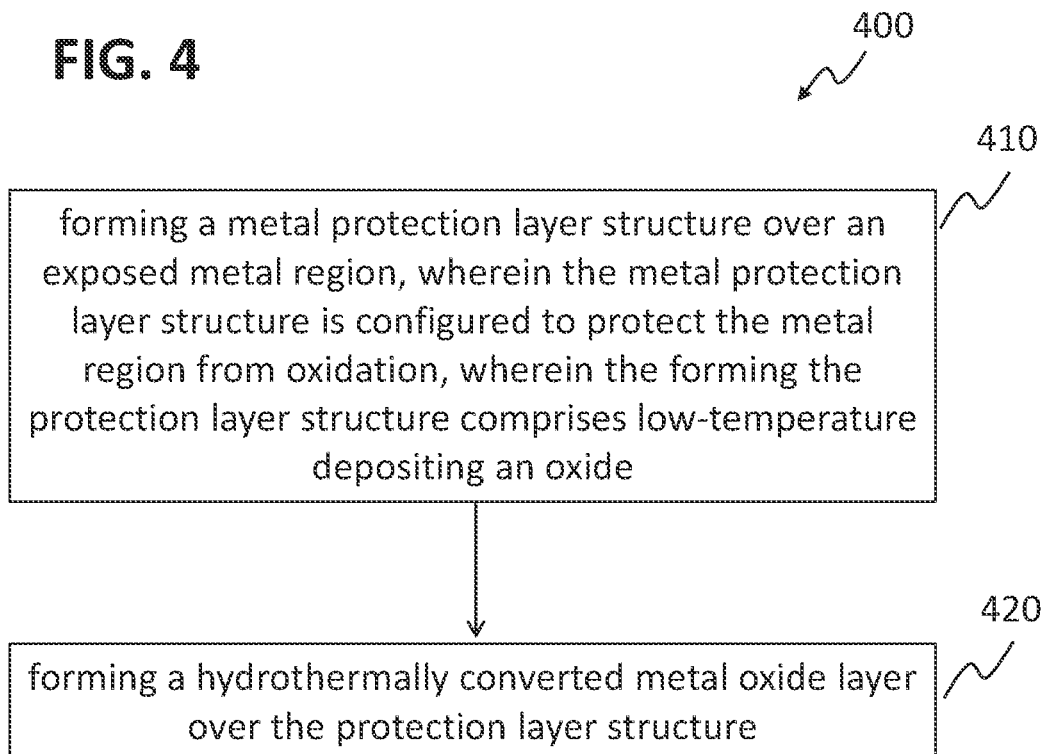
FIG. 4 shows a flow diagram of a method of forming a chip package in accordance with various embodiments.

FIG. 4 shows a flow diagram 400 of a method of forming a chip package including a chip and an exposed metal region in accordance with various embodiments.

The method may include forming a metal protection layer structure over the exposed metal region, wherein the metal protection layer structure is configured to protect the metal region from oxidation, wherein the forming the protection layer structure includes low-temperature depositing an oxide (410), and forming a hydrothermally converted metal oxide layer over the protection layer structure (420).

Various examples will be illustrated in the following:

Example 1 is a chip package. The chip package may include at least one chip, an exposed metal region, a metal protection layer structure over the exposed metal region and configured to protect the metal region from oxidation, the protection layer structure comprising a low-temperature deposited oxide, and a hydrothermally converted metal oxide layer over the protection layer structure.

In Example 2, the subject matter of Example 1 may optionally further include that the low-temperature deposited oxide includes or consists of a metal oxide.

In Example 3, the subject matter of Example 1 or 2 may optionally further include that the hydrothermally converted metal oxide layer includes or consists of an aluminum hydroxide layer.

In Example 4, the subject matter of any of Examples 1 to 3 may optionally further include an aluminum oxide layer between the metal protection layer structure and the hydrothermally converted metal oxide layer.

In Example 5, the subject matter of any of Examples 1 to 4 may optionally further include that the metal protection layer structure includes a top layer including at least one of a group of materials, the group consisting of silicon dioxide, titanium dioxide, zinc oxide, hafnium dioxide, tantalum pentoxide ($Ta_2O_5$), and zirconium dioxide.

In Example 6, the subject matter of any of Example 5 may optionally further include that the metal protection layer structure includes an aluminum oxide layer between the top layer and the exposed metal region.

In Example 7, the subject matter of any of Examples 1 to 4 may optionally further include that the metal protection layer structure includes aluminum oxide with a top layer of doped aluminum oxide.

In Example 8, the subject matter of any of Examples 1 to 7 may optionally further include that the exposed metal region includes at least one of a group of metal regions, the group consisting of a chip pad, a leadframe, a wire bond, a clip, and a stripe bond.

In Example 9, the subject matter of any of Examples 1 to 8 may optionally further include that the exposed metal region includes at least one of a group of materials, the group consisting of copper (Cu), nickel (Ni), aluminum (Al), gold (Au), silver (Ag), palladium (Pd), and alloys thereof, for example nickel phosphorus (NiP) and/or PdAuAg.

In Example 10, the subject matter of any of Examples 1 to 9 may optionally further include that the low-temperature deposited oxide of the metal protection layer structure is an amorphous oxide or microcrystalline.

In Example 11, the subject matter of any of Examples 1 to 10 may optionally further include an encapsulation material attached to at least a portion of the exposed metal region by the metal protection layer structure and the hydrothermally converted metal oxide layer.

In Example 12, the subject matter of any of Examples 1 to 11 may optionally further include a non-metal layer, wherein the encapsulation material is further attached to at least a portion of the non-metal layer.

In Example 13, the subject matter of Example 12 may optionally further include that the non-metal layer includes or consists of an organic material, for example an imide.

In Example 14, the subject matter of any of Examples 1 to 13 may optionally further include that the metal protection layer structure forms a hydrolysis stopping layer.

In Example 15, the subject matter of any of Examples 1 to 14 may optionally further include that the metal protection layer structure is an adhesion layer structure.

Example 16 is a method of forming a chip package including a chip and an exposed metal region. The method may include forming a metal protection layer structure over the exposed metal region, wherein the metal protection layer structure is configured to protect the metal region from oxidation, wherein the forming the protection layer structure includes low-temperature depositing an oxide, and forming a hydrothermally converted metal oxide layer over the protection layer structure.

In Example 17, the subject matter of Example 16 may optionally further include that the low-temperature deposited oxide includes or consists of a metal oxide.

In Example 18, the subject matter of Example 16 or 17 may optionally further include that the hydrothermally converted metal oxide layer includes or consists of an aluminum hydroxide layer.

In Example 19, the subject matter of any of Examples 16 to 18 may optionally further include forming an aluminum oxide layer between the metal protection layer structure and the hydrothermally converted metal oxide layer.

In Example 20, the subject matter of any of Examples 16 to 19 may optionally further include that the forming the metal protection layer structure includes forming a top layer including at least one of a group of materials, the group consisting of silicon dioxide, hafnium dioxide, titanium dioxide, zinc oxide, and zirconium dioxide.

In Example 21, the subject matter of Example 20 may optionally further include that the forming the metal protection layer structure includes forming an aluminum oxide layer between the top layer and the exposed metal region.

In Example 22, the subject matter of any of Examples 16 to 19 may optionally further include that the forming the metal protection layer structure includes forming an aluminum oxide layer, and doping a top layer of the aluminum oxide layer, for example doping with silicon.

In Example 23, the subject matter of any of Examples 16 to 22 may optionally further include that the exposed metal region includes at least one of a group of metal regions, the group consisting of a chip pad, a leadframe, a wire bond, a clip, and a stripe bond.

In Example 24, the subject matter of any of Examples 16 to 23 may optionally further include that the exposed metal region includes at least one of a group of materials, the group consisting of copper (Cu), nickel (Ni), aluminum (Al), gold (Au), silver (Ag), palladium (Pd), and alloys thereof, for example nickel phosphorus (NiP) and/or PdAuAg.

In Example 25, the subject matter of Example 16 to 24 may optionally further include that the low-temperature deposited oxide of the metal protection layer structure is an amorphous oxide or microcrystalline.

In Example 26, the subject matter of any of Examples 16 to 25 may optionally further include forming an encapsulation material attached to at least a portion of the exposed metal region by the metal protection layer structure and the hydrothermally converted metal oxide layer.

In Example 27, the subject matter of Example 26 may optionally further include forming a non-metal layer; wherein the encapsulation material is further attached to at least a portion of the non-metal layer.

In Example 28, the subject matter of Example 27 may optionally further include that the non-metal layer includes or consists of an organic material, for example an imide.

In Example 29, the subject matter of Example 16 to 28 may optionally further include that the metal protection layer structure forms a hydrolysis stopping layer.

In Example 30, the subject matter of Example 16 to 29 may optionally further include that the metal protection layer structure is configured to act as an adhesion layer for the exposed metal region In Example 31, the subject matter of Examples 16 to 30 may optionally further include that the forming the hydrothermally converted metal oxide layer over the protection layer structure includes forming a metal oxide layer over the protection layer, and placing the metal oxide layer in a heated aqueous solution.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A chip package, comprising:
   at least one chip;
   an exposed metal region and non-metal region;
   a metal protection layer structure over the exposed metal region and non-metal region, the protection layer structure comprising a low-temperature deposited oxide; and
   a hydrothermally converted metal oxide layer over the protection layer structure.

2. The chip package according to claim 1, wherein the low-temperature deposited oxide comprises or consists of a metal oxide.

3. The chip package according to claim 1, wherein the hydrothermally converted metal oxide layer comprises or consists of an aluminum hydroxide layer.

4. A chip package, comprising:
   at least one chip;
   an exposed metal region and non-metal region;
   a metal protection layer structure over the exposed metal region and non-metal region, and configured to protect the metal region from oxidation;
   a hydrothermally converted metal oxide layer over the protection layer structure; and
   an aluminum oxide layer between the metal protection layer structure and the hydrothermally converted metal oxide layer.

5. The chip package according to claim 1, wherein the metal protection layer structure comprises a top layer comprising at least one of a group of materials, the group consisting of:
   silicon dioxide;
   titanium dioxide;
   zinc oxide;
   hafnium dioxide;
   tantalum pentoxide; and
   zirconium dioxide.

6. The chip package according claim 5, wherein the metal protection layer structure comprises an aluminum oxide layer between the top layer and the exposed metal region.

7. The chip package according to claim 1, wherein the metal protection layer structure comprises aluminum oxide with a top layer of doped aluminum oxide.

8. The chip package according to claim 1, wherein the exposed metal region comprises at least one of a group of metal regions, the group consisting of:
   a chip pad;
   a leadframe;
   a wire bond;
   a clip; and
   a stripe bond.

9. The chip package according to claim 1, wherein the exposed metal region comprises at least one of a group of materials, the group consisting of:
   copper (Cu);
   nickel (Ni);
   nickel-phosphorus (NiP);
   aluminum (Al);
   gold (Au);
   silver (Ag);
   palladium (Pd); and
   alloys thereof, for example PdAuAg.

10. The chip package according to claim 1, further comprising:
    an encapsulation material attached to at least a portion of the exposed metal region by the metal protection layer structure and the hydrothermally converted metal oxide layer.

11. The chip package according to claim 10, further comprising:
    a non-metal layer;
    wherein the encapsulation material is further attached to at least a portion of the non-metal layer.

12. A chip package, comprising:
    at least one chip positioned on a leadframe surface;
    an exposed metal region and non-metal region on a surface of the at least one chip;
    a metal protection layer structure over the exposed metal region and non-metal region, the protection layer structure comprising a metal oxide; and
    a hydrothermally converted metal oxide layer over the protection layer structure.

13. The chip package according to claim 12, wherein the metal oxide comprises an aluminum oxide.

14. The chip package according to claim 12, where the hydrothermally converted metal oxide layer comprises an aluminum hydroxide layer.

15. The chip package of claim 12, where the metal protection layer structure comprises a multilayer formed by a plurality of single layers.

16. The chip package of claim 15, where one or more of the plurality of single layers are made of different material.

17. The chip package of claim 12, where the metal protection layer structure is an adhesion layer structure.

18. The chip package of claim 12, where the metal protection layer structure includes a moisture resistant doped region that is doped with silicon.

19. The chip package of claim 12, further comprising:
    an encapsulation material attached to at least a portion of the exposed metal region and non-metal region by the metal protection layer structure and the hydrothermally converted metal oxide layer.

20. The chip package of claim 12, where the metal protection layer structure and the hydrothermally converted metal oxide layer extend directly over the leadframe surface.

* * * * *